(12) United States Patent
Chi

(10) Patent No.: US 11,916,046 B2
(45) Date of Patent: Feb. 27, 2024

(54) DISPLAY PANEL AND DISPLAY DEVICE

(71) Applicant: Xiamen Tianma Micro-Electronics Co., Ltd., Xiamen (CN)

(72) Inventor: Xiao Chi, Shanghai (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 546 days.

(21) Appl. No.: 17/138,825

(22) Filed: Dec. 30, 2020

(65) Prior Publication Data

US 2021/0118857 A1 Apr. 22, 2021

(30) Foreign Application Priority Data

Sep. 29, 2020 (CN) .......................... 202011046236.0

(51) Int. Cl.
*H01L 29/18* (2006.01)
*H01L 25/075* (2006.01)
*H01L 33/00* (2010.01)

(52) U.S. Cl.
CPC ................................ *H01L 25/0753* (2013.01)

(58) Field of Classification Search
CPC ... H01L 25/0753; H01L 25/167; H01L 33/62; H01L 27/156; H01L 27/0207; H01L 33/48

See application file for complete search history.

(56) References Cited

U.S. PATENT DOCUMENTS 9,985,009 B2* 5/2018 Wu ........................ H01L 33/504
2016/0351548 A1* 12/2016 Chen ................... H01L 25/0753
2021/0343230 A1* 11/2021 Wang ........................ G09G 3/32

FOREIGN PATENT DOCUMENTS

CN 105023522 A 11/2015

* cited by examiner

*Primary Examiner* — Ismail A Muse
(74) *Attorney, Agent, or Firm* — CHRISTENSEN O'CONNOR JOHNSON KINDNESS PLLC

(57) ABSTRACT

Provided are a display panel and a display device. The display panel includes a display area including pixel areas, each of which includes at least two sub-pixel areas each including a display light-emitting diode. The sub-pixel areas include shared sub-pixel areas, each of which is shared by at least two pixel areas and includes m spare binding areas, where m≥2. The shared sub-pixel areas include a first shared sub-pixel area, in which the display light-emitting diode does not emit light. Each first shared sub-pixel area includes n spare light-emitting diodes, where 2≤n≤m. When the display panel is driven to emit light, standard brightness required to be displayed by each first shared sub-pixel area is L1 and luminous brightness of each spare light-emitting diode in the first shared sub-pixel area is L2, where L2<L1. The present disclosure can weaken influence on display effect caused by shifting of the light-emitting center.

20 Claims, 14 Drawing Sheets

DISPLAY PANEL AND DISPLAY DEVICE

CROSS-REFERENCE TO RELATED APPLICATIONS

The present application claims priority to Chinese Patent Application No. 202011046236.0, filed on Sep. 29, 2020, the content of which is incorporated herein by reference in its entirety.

TECHNICAL FIELD

The present disclosure relates to the field of display technology, for example, to a display panel and a display device.

BACKGROUND

As for the micro LED display panel, in a manufacturing process thereof, light-emitting diodes formed on a growth substrate can be transplanted to an array substrate by mass transfer, and as too many light-emitting diodes need to be transferred, it is inevitable that some light-emitting diodes cannot emit light normally due to the transplanting yield, in other words, dead pixels appear. For this reason, in the related art, a spare binding area is usually reserved next to the binding area for each light-emitting diode on the array substrate. When a transplanted light-emitting diode fails to emit light normally, a spare light-emitting diode is re-bound in the spare binding area next to the transplanted light-emitting diode, and the spare light-emitting diode is used to compensate the luminous brightness of the light-emitting diode that fails.

However, based on an existing commonly used arrangement of sub-pixels, when a light-emitting diode transplanted to a sub-pixel cannot emit light and a spare light-emitting diode is re-bonded next to it, a large abnormal display area will appear, and this has a great impact on an overall display effect of the display panel.

SUMMARY

In view of this, embodiments of the present disclosure provide a display panel and a display device, aiming to weaken the influence on the display effect caused by shifting of a light-emitting center of the spare light-emitting diode.

In an aspect, an embodiment of the present disclosure provides a display panel, including a plurality of pixel areas, each of the plurality of pixel areas including at least two sub-pixel areas, each of the at least two sub-pixel areas being provided with a display light-emitting diode. All sub-pixel areas of the plurality of pixel areas include shared sub-pixel areas, each of the shared sub-pixel areas is shared by at least two of the plurality of pixel areas, and each of the shared sub-pixel areas includes m spare binding areas, to each of which spare binding area a respective one spare light-emitting diode is configured to be bound, where m is a positive integer larger and m≥2. The shared sub-pixel areas include at least one first shared sub-pixel area in each of which the respective display light-emitting diode does not emit light when the display panel is driven to emit light; and each of the at least one first shared sub-pixel area is further provided with n spare light-emitting diodes, where n is a positive integer and 2≤n≤m. When the display panel is driven to emit light, a standard brightness required to be displayed by each of the at least one first shared sub-pixel area is L1, and a luminous brightness of each of the n spare light-emitting diodes in the first shared sub-pixel area is L2, where L2<L1.

In another aspect, an embodiment of the present disclosure provides a display device including the above-mentioned display panel.

BRIEF DESCRIPTION OF DRAWINGS

In order to explain the technical solutions of the embodiments of the present disclosure more clearly, the following will briefly introduce the drawings needed in the embodiments. The drawings in the following description are only representative embodiments of the present disclosure.

DETAILED DESCRIPTION

In order to better understand the technical solutions of the present disclosure, the embodiments of the present disclosure will be described in detail below with reference to the accompanying drawings.

It should be clear that the described embodiments are only representative embodiments of the present disclosure, rather than all the embodiments. Based on the embodiments of the present disclosure, all other embodiments obtained by those of ordinary skill in the art shall fall within the protection scope of the present disclosure.

The terms used in the embodiments of the present disclosure are for the purpose of describing representative embodiments, and are not intended to limit the present disclosure. The singular forms of "a", "said" and "the" used in the embodiments of the present disclosure and the appended claims are also intended to include plural forms, unless the context clearly indicates other meanings.

It should be understood that the term "and/or" used herein is an association relationship describing associated objects, which means that there can be three types of relationships, for example, A and/or B can mean three cases, i.e., there is A alone, both A and B, there is B alone. In addition, the character "/" in text generally indicates that the associated objects in front of and behind it are in an "or" relationship.

It should be understood that although the terms "first" and "second" may be used to describe the spare light-emitting diodes in the embodiments of the present disclosure, these spare light-emitting diodes should not be limited to these terms, and these terms are used to distinguish spare light-emitting diodes from each other. For example, without departing from the scope of the embodiments of the present disclosure, the first spare light-emitting diode may also be referred to as the second spare light-emitting diode, and similarly, the second spare light-emitting diode may also be referred to as the first spare light-emitting diode.

Figure 1:
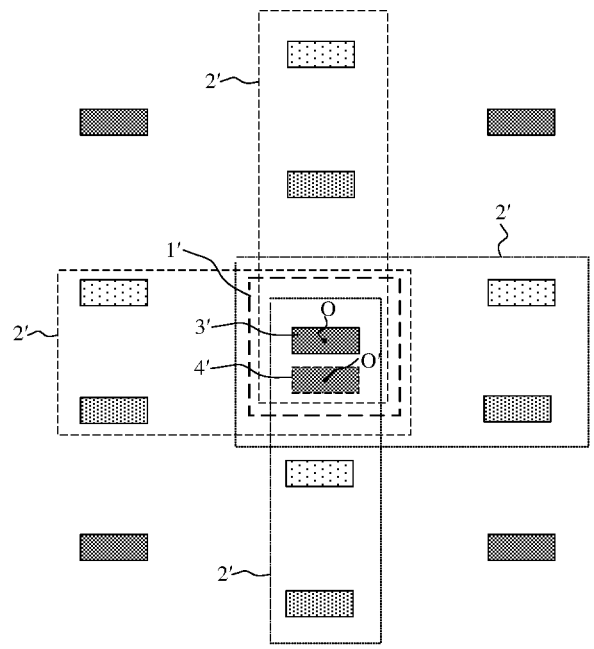
FIG. 1 is a schematic diagram of an arrangement of sub-pixels in the related art.

Before describing the technical solutions provided by the embodiments of the present disclosure, the present disclosure first explains the existing problems:

In the existing commonly used arrangement of sub-pixels, one sub-pixel may be shared by multiple pixels. For example, in the schematic diagram of the arrangement of sub-pixels as shown in FIG. 1, one sub-pixel 1' is shared by at least four pixels 2', in this case, when the light-emitting diode 3' transplanted into the sub-pixel 1' fails to emit light, a spare light-emitting diode 4' is re-bonded next to it, and as a result, the light-emitting center of the sub-pixel 1' will shift from a center point O of the original light-emitting diode 3' to a center point O' of the spare light-emitting diode 4', thereby influencing luminous brightness of an area where the sub-pixel 1' and the multiple pixels 2' sharing the sub-pixel 1' are located. As a result, a large abnormal display area appears, thereby having a great impact on the overall display effect of the display panel.

Figure 2:
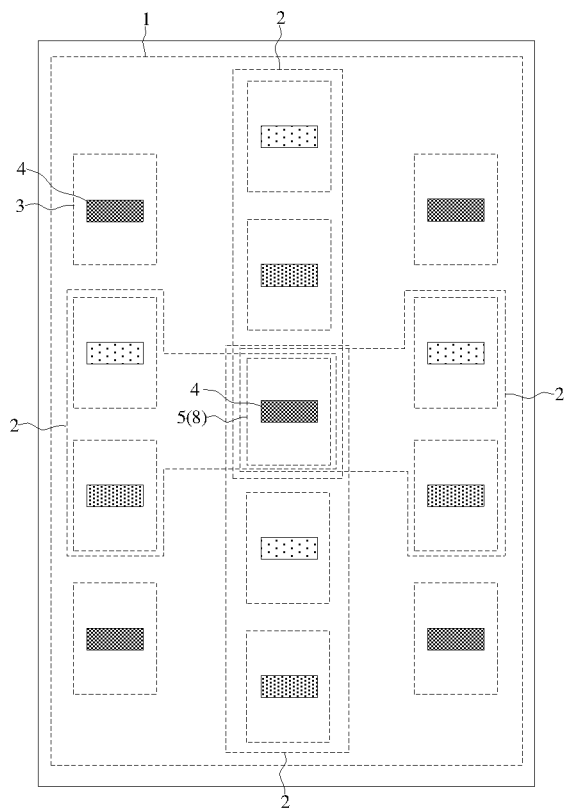
FIG. 2 is a schematic structural diagram of a display panel provided by an embodiment of the present disclosure.

In order to solve the above-mentioned problems, an embodiment of the present disclosure provides a display panel, which may be a micro LED display panel, as shown in FIG. 2. FIG. 2 is a schematic structural diagram of the display panel provided by the embodiment of the present disclosure. As shown in FIG. 2, the display panel includes a display area 1, the display area 1 includes a plurality of pixel areas 2, each pixel area 2 includes at least two sub-pixel areas 3, and each sub-pixel area 3 includes one display light-emitting diode 4.

Figure 3:
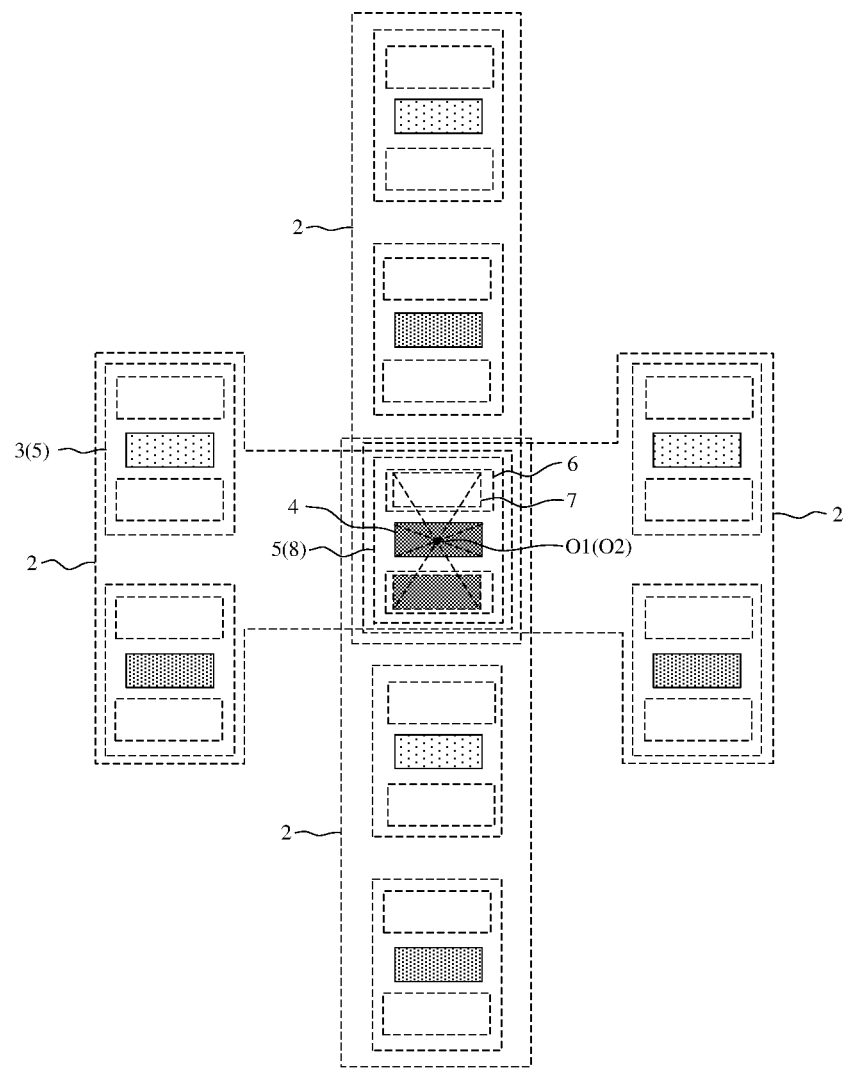
FIG. 3 is a schematic diagram of a structure of a first shared sub-pixel area provided by an embodiment of the present disclosure.

FIG. 3 is a schematic structural diagram of a first shared sub-pixel area provided by an embodiment of the present disclosure. As shown in FIG. 3, the sub-pixel areas 3 include shared sub-pixel areas 5, and each shared sub-pixel area 5 is shared by at least two pixel areas. Each shared sub-pixel area 5 includes m spare binding areas 6, to each of which one spare light-emitting diode 7 is to be bound, where m≥2.

Referring to FIG. 3 again, the shared sub-pixel areas 5 include a first shared sub-pixel area 8. When the display panel is driven to emit light, the display light-emitting diode 4 in the first shared sub-pixel area 8 does not emit light. The first shared sub-pixel area 8 further includes n spare light-emitting diodes 7, where 2≤n≤m. When the display panel is driven to emit light, a standard brightness required to be displayed by the first shared sub-pixel area 8 is L1, and each spare light-emitting diode 7 in the first shared sub-pixel area 8 has a luminous brightness of L2, where L2<L1. It can be understood that both m and n mentioned above are positive integers.

It should be noted that, in a manufacturing process of the above-mentioned display panel, a plurality of light-emitting diodes can be formed on an array substrate by mass transfer or directly being grown on the array substrate, and then a light emitting test is performed on these light-emitting diodes to determine whether these light-emitting diodes can emit light normally. If it is detected that some light-emitting diodes fail to emit light, spare light-emitting diodes are re-bound in the sub-pixel areas 3 where these light-emitting diodes are located, so as to compensate the brightness of the failed light-emitting diodes. Here, the "display light-emitting diode 4" in this embodiment of the present disclosure refers to the light-emitting diode initially formed on the array substrate, the "first shared sub-pixel area 8" refers to a shared sub-pixel area 5 where the display light-emitting diode 4 that cannot normally emit light is located, and the "spare light-emitting diode 7" refers to a light-emitting diode that is subsequently re-bound to compensate the brightness of the failed display light-emitting diode 4. Each of the display light-emitting diode 4 and the spare light-emitting diode 7 may be a micro LED.

In addition, it can be understood that a complete image displayed by the display panel is formed by light output brightness of all the sub-pixel areas 3 in the display area 1. Therefore, when the display panel is driven to display an image, a driving chip first determines display grayscales corresponding to the respective sub-pixel areas 3 according to the image required to be displayed, then generates and provides data voltages corresponding to the display grayscales to the respective sub-pixel areas 3, thereby driving each sub-pixel area 3 to present a standard brightness corresponding to the respective display grayscale. Therefore, the "standard brightness L1 required to be displayed by the first shared sub-pixel area 8" in this embodiment of the present disclosure refers to brightness corresponding to the display grayscale required to be displayed by the first shared sub-pixel area 8 when the display panel is driven to display an image.

In the display panel provided by this embodiment of the present disclosure, by providing a plurality of spare binding areas 6 in the shared sub-pixel area 5, when it is detected that the light-emitting diode 4 in a certain shared sub-pixel area 5 (the first shared sub-pixel area 8) cannot emit light normally, at least two spare light-emitting diodes 7 can be bound in the first shared sub-pixel area 8. In this way, an equivalent light-emitting center O2 of an entire light-emitting area formed by the re-bound spare light-emitting diodes 7 can be adjusted according to the binding number and binding positions of the spare light-emitting diodes 7 so that the equivalent light-emitting center O2 approaches the light-emitting center O1 of the original display light-emitting diode 4 in the first shared sub-pixel area 8, thereby alleviating the problem of shifting of the light-emitting center of the first shared sub-pixel area 8. In this way, the problem of abnormal display of the first shared sub-pixel area 8 is alleviated, and the influence on brightness borrowing of the pixel area 2 from the first shared sub-pixel area 8 is reduced, thereby alleviating a problem of deviation of luminous brightness of the pixel area 2 caused by shifting of the light-emitting center, and thus significantly reducing or eliminating the abnormal display area and optimizing the overall display effect of the display panel.

Moreover, after the spare light-emitting diodes 7 are re-bound in the first shared sub-pixel area 8, the luminous brightness of each spare light-emitting diode 7 is smaller than the standard brightness required to be displayed by the first shared sub-pixel area 8, so as to avoid an excessively large difference between a total luminous brightness of the spare light-emitting diodes 7 and the standard brightness corresponding to the first shared sub-pixel area 8 where the spare light-emitting diodes 7 are located, that is, to avoid that the actual luminous brightness of the first shared sub-pixel area 8 differs too much from the standard brightness, thereby achieving more accurate brightness compensation for the first shared sub-pixel area 8, and thus further weakening the abnormal display phenomenon of the first shared sub-pixel area 8 and the pixel areas 2 sharing the first shared sub-pixel area 8.

Figure 4:
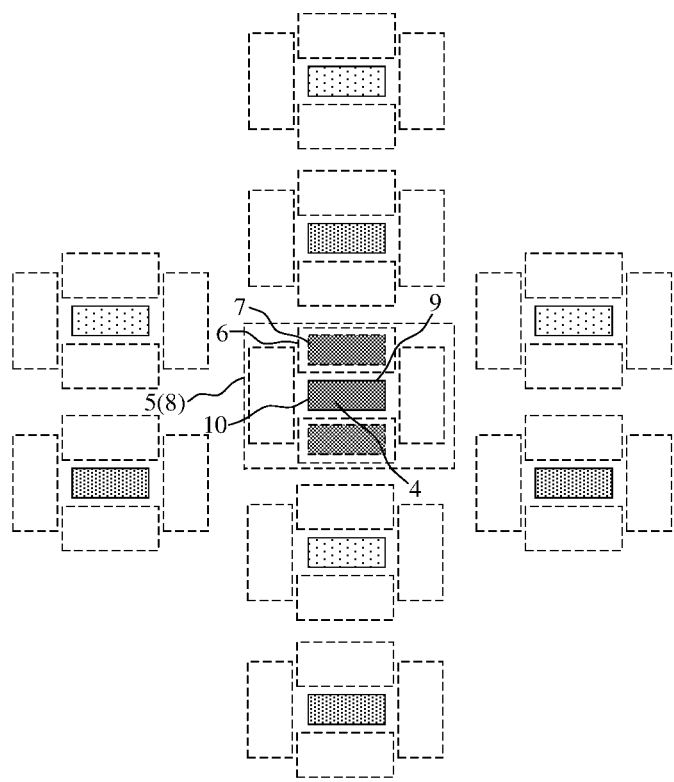
FIG. 4 is a schematic diagram of another structure of the first shared sub-pixel area provided by an embodiment of the present disclosure.

In addition, it should be noted that, referring to FIG. 3 again, the number of spare light-emitting diodes 7 bound in the first shared sub-pixel area 8 may be equal to the number of spare binding areas 6, that is, n=m. In this case, each spare light-emitting diode 7 is correspondingly bound in a respective one spare binding area 6. FIG. 4 is a schematic diagram of another structure of the first shared sub-pixel area provided by the embodiment of the present disclosure. As shown in FIG. 4, when m>2, the number of spare light-emitting diodes 7 bound in the first shared sub-pixel area 8 may be different from the number of spare binding areas 6, that is, only partial spare binding areas 6 are bound with the spare light-emitting diodes 7, and the remaining spare binding areas 6 are not bound with the spare light-emitting diode 7. The binding situations of the spare light-emitting diodes 7 shown in FIG. 3 and FIG. 4 are merely for schematic illustration, and in practical applications, the binding number and binding positions of the spare light-emitting diodes 7 can be specifically set according to actual requirements.

In an embodiment, in the first shared sub-pixel area 8, the total luminous brightness of the n spare light-emitting diodes 7 is L3. In order to achieve more accurate brightness compensation for the first shared sub-pixel area 8 by using the spare light-emitting diodes 7, the actual luminous brightness of the first shared sub-pixel area 8 approaches the standard brightness, e.g., L3 satisfies: $0.8*L1 \leq L3 \leq 1.2*L1$, in order to weaken the display abnormality of the first shared sub-pixel area 8 and the pixel areas 2 sharing the first shared sub-pixel area 8 to a greater extent.

Further, let L3=L1, so that the actual luminous brightness of the first shared sub-pixel area 8 is the same as the corresponding standard brightness, thereby ensuring that the luminous brightness of the first shared sub-pixel area 8 and the pixel areas 2 sharing the first shared sub-pixel area 8 is not affected.

In an embodiment, referring to FIG. 4 again, in a first shared sub-pixel area 8, n spare light-emitting diodes 7 are respectively located at opposite sides of the display light-emitting diode 4. Specifically, the display light-emitting diode 4 has a first side 9 and a second side 10 opposite to each other. Some of the n spare light-emitting diodes 7 are located at the first side 9 of the display light-emitting diode 4, and the remaining spare light-emitting diodes 7 are located at the second side 10 of the display light-emitting diode 4, in such a manner that an equivalent light-emitting center of an entire light-emitting area formed by the n spare light-emitting diodes 7 is located in an area between the first side 9 and the second side 10 of the display light-emitting diode 4. In this way, the equivalent light-emitting center further approaches the light-emitting center of the original display light-emitting diode 4, thereby weakening the display abnormality of the first shared sub-pixel area 8 and the pixel areas 2 sharing the first shared sub-pixel area 8.

Figure 5:
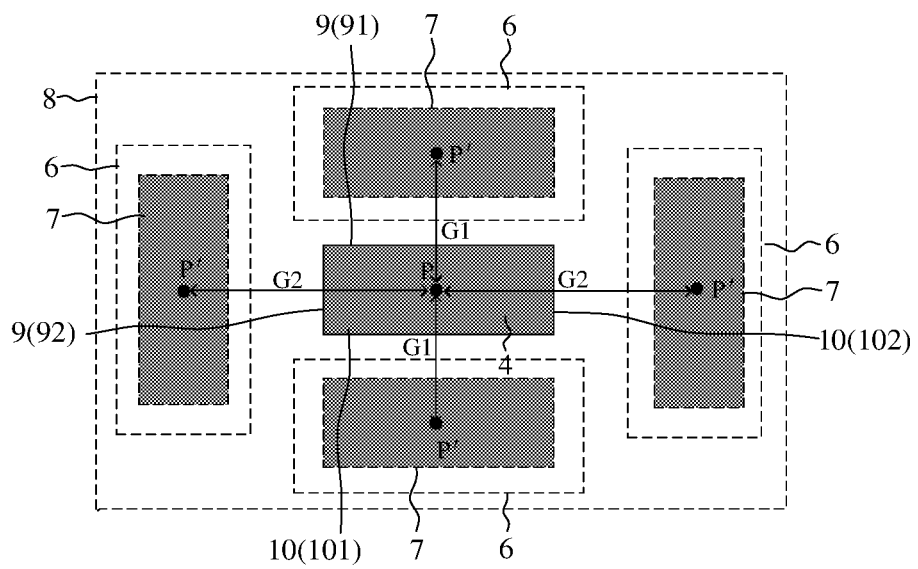
FIG. 5 is a schematic diagram of still another structure of the first shared sub-pixel area provided by an embodiment of the present disclosure.
Figure 6:
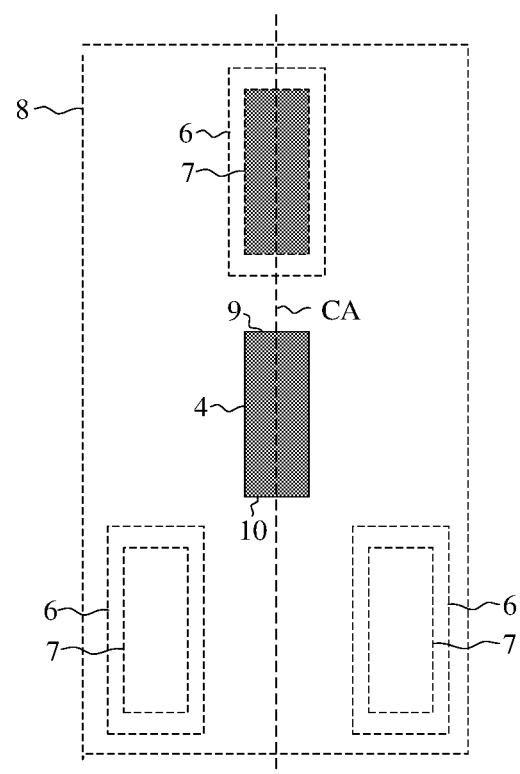
FIG. 6 is a schematic diagram of still another structure of the first shared sub-pixel area provided by an embodiment of the present disclosure.

FIG. 5 is a schematic diagram of still another structure of the first shared sub-pixel area provided by the embodiment of the present disclosure. In order to improve regularity of the binding positions of the spare light-emitting diodes 7 in the first shared sub-pixel area 8, and to further improve light-emitting uniformity of the first shared sub-pixel area 8, as shown in FIG. 5, the spare light-emitting diodes 7 located at opposite sides of the display light-emitting diode 4 are symmetrically distributed around the center point P of the display light-emitting diode 4. FIG. 6 is a schematic diagram of still another structure of the first shared sub-pixel area provided by an embodiment of the present disclosure. As shown in FIG. 6, n spare light-emitting diodes are symmetrically distributed along a central axis CA of the display light-emitting diode.

It should be noted that, referring to FIG. 5 again, when the display light-emitting diode 4 has a rectangular shape, the display light-emitting diode 4 has a first side 91 and a second side 101 that are opposite to each other, and a first side 92 and a second side 102 that are opposite to each other. The spare light-emitting diodes 7 located at the first side 91 and the second side 101 of the display light-emitting diode 4 are symmetrically distributed about the center point P of the display light-emitting diode 4, and a distance between a center point P' of each of these light-emitting diodes 4 and the enter point P of the display light-emitting diode 4 is G1. The spare light-emitting diodes 7 located at the first side 92 and the second side 102 of the display light-emitting diode 4 are also symmetrically distributed about the center point P of the display light-emitting diode 4, and a distance between a center point P' of each of these spare light-emitting diodes 7 and the center point P of the display light-emitting diode 4 is G2. Here, G1 may be equal to or different from G2.

Herein, the center point P of the display light-emitting diode 4 can be understood as a center of a geometric shape of the display light-emitting diode 4, and the center point P' of the spare light-emitting diode 7 can be understood as a center of the geometric shape of the spare light-emitting diode 7.

Figure 7:
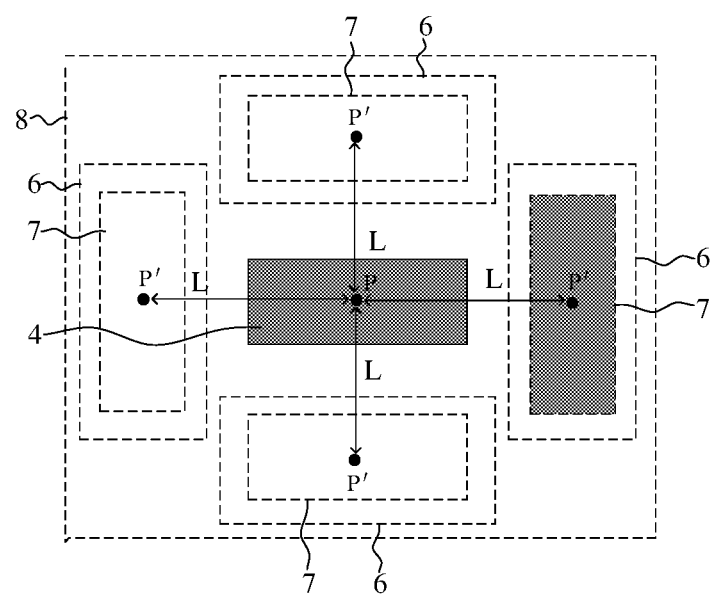
FIG. 7 is a schematic diagram of still another structure of the first shared sub-pixel area provided by an embodiment of the present disclosure.

FIG. 7 is a schematic diagram of still another structure of the first shared sub-pixel area provided by an embodiment of the present disclosure. As shown in FIG. 7, in one first shared sub-pixel area 8, the spare light-emitting diodes 7 have an identical luminous brightness, and a distance between the center point P' of each spare light-emitting diode 7 and the center point P of the display light-emitting diode 4 is identical. This configuration improves luminous uniformity of different areas of the first shared sub-pixel area 8 and further optimize the display effect of the first shared sub-pixel area 8, but also allow the equivalent light-emitting center of the entire light-emitting area formed by the spare light-emitting diodes 7 to be closer to the light-emitting center of the original display light-emitting diode 4, thereby further weakening the display abnormality of the first shared sub-pixel area 8 and the pixel areas 2 sharing the first shared sub-pixel area 8.

It should be noted that the drawings of the embodiments of the present disclosure are based on the example that the spare light-emitting diodes 7 and the display light-emitting diodes 4 are rectangular in shape. In other optional embodiments of the present disclosure, the spare light-emitting diodes 7 and the display light-emitting diodes 4 may also adopt other regular shapes, such as circle, diamond, etc., or an irregular shape. In this case, the distance between the spare light-emitting diode 7 and the display light-emitting diode 4 can still be defined as the distance between the center point P' of the spare light-emitting diode 7 and the center point P of the display light-emitting diode 4.

In addition, it should be noted that, in the display panel, the display light-emitting diode 4 and the spare light-emitting diode 7 can be either horizontally bound as shown in FIG. 5 or vertically bound as shown in FIG. 6. The specific binding manners of the display light-emitting diodes 4 and the spare light-emitting diodes 7 can be adjusted according to the design of the display panel, which is not specifically limited in the embodiments of the present disclosure.

Figure 8:
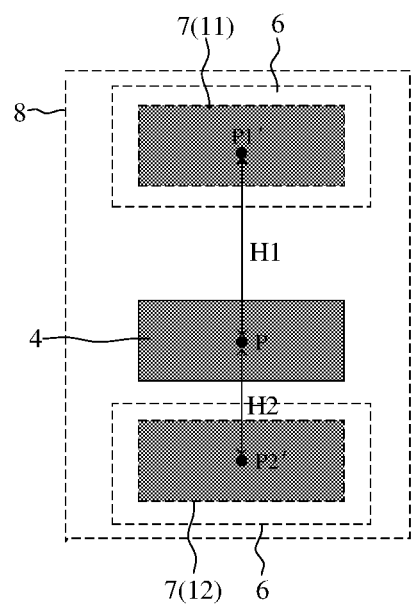
FIG. 8 is a schematic diagram of still another structure of the first shared sub-pixel area provided by an embodiment of the present disclosure.

FIG. 8 is a schematic diagram of another structure of the first shared sub-pixel area provided by an embodiment of the present disclosure. In an embodiment, as shown in FIG. 8, in one first shared sub-pixel area 8, the spare light-emitting diodes 7 includes a first spare light-emitting diode 11 and a second spare light-emitting diode 12. A luminous brightness of the first spare light-emitting diode 11 is L21, and a luminous brightness of the second spare light-emitting diode is L22, where L21>L22. A distance between a center point P1' of the first spare light-emitting diode 11 and the center point P of the display light-emitting diode 4 is H1, and a distance between a center point P2' of the second spare light-emitting diode 12 and the center point P of the display light-emitting diode 4 is H2, where H1<H2.

Herein, the above-mentioned first spare light-emitting diode 11 and second spare light-emitting diode 12 are not a specific limitation on two specific spare light-emitting diodes 7. When any two spare light-emitting diodes 7 in the first shared sub-pixel area 8 have different luminous brightnesses, the spare light-emitting diode 7 with a larger luminous brightness can be defined as the first spare light-emitting diode 11, and the other spare light-emitting diode 7 with a smaller luminous brightness can be defined as the second spare light-emitting diode 12.

For the first spare light-emitting diode 11 with a larger luminous brightness, its luminous brightness contributes more to the total luminous brightness of the spare light-emitting diodes 7 in the first shared sub-pixel area 8. Therefore, the equivalent light-emitting center of the overall light-emitting area formed by these spare light-emitting diodes 7 is closer to the position where the first spare light-emitting diode 11 is located. By arranging the first spare light-emitting diode 11 closer to the display light-emitting diode 4, the equivalent light-emitting center of the overall light emitting area formed by the spare light-emitting diodes 7 can be closer to the light-emitting center of the original display light-emitting diode 4, thereby further avoiding shifting of the light-emitting center of the first shared sub-pixel area 8.

In an embodiment, referring to FIG. 3 again, the shared sub-pixel area 5 is shared by k pixel areas 2, where m<k. That is, the number of spare binding areas 6 provided in the shared sub-pixel area 5 is smaller than the number of pixel areas 2 sharing the shared sub-pixel area 5.

It is understandable that when it is detected that the display light-emitting diode 4 in the shared sub-pixel area 5 can emit light normally, there is no need to bind the spare light-emitting diode 7 in the shared sub-pixel area 5. Then, when the shared sub-pixel area 5 is driven to emit light, the area where each spare binding area 6 is located forms a non-light-emitting area. By setting m<k, it ensures that the number of spare binding areas 6 provided in the shared sub-pixel area 5 is reduced while the pixel areas 2 can normally borrow the brightness of the shared sub-pixel area 5, thereby reducing the non-light-emitting area in the shared sub-pixel area 5 and optimizing the display effect of the shared sub-pixel area 5. In addition, arranging a smaller number of spare binding areas 6 in the shared sub-pixel area 5 can also reduce the space occupied by the shared sub-pixel area 5 and increase the number of shared sub-pixel areas 5 that can be arranged in a unit area, thereby effectively increasing the resolution of the display panel.

Figure 9:
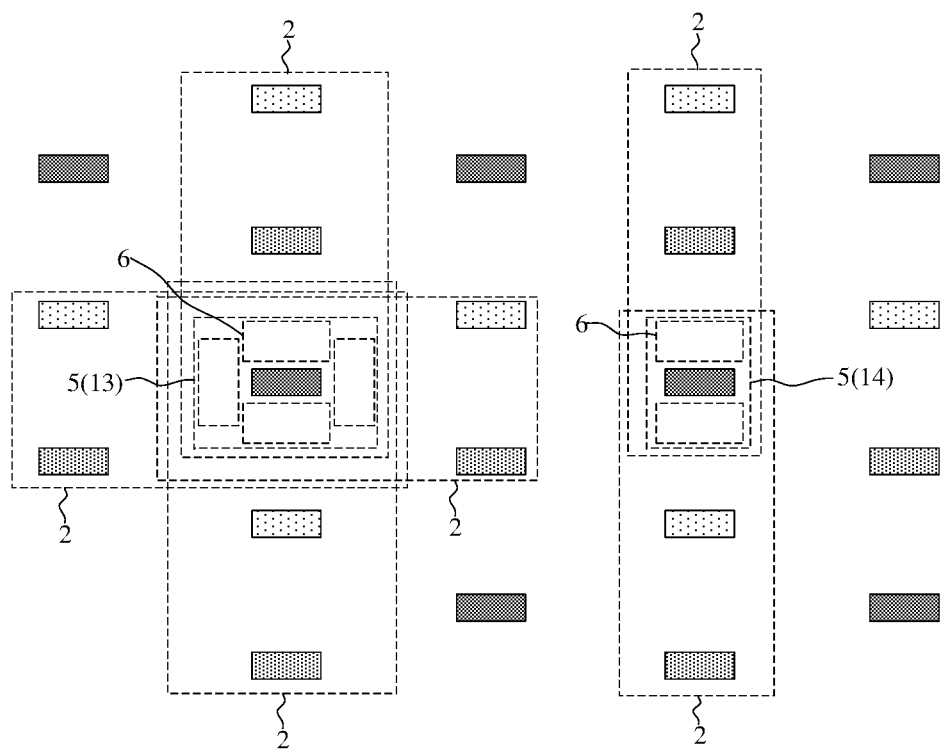
FIG. 9 is a schematic diagram of a structure of a shared sub-pixel area provided by an embodiment of the present disclosure.

FIG. 9 is a schematic structural diagram of a shared sub-pixel area provided by an embodiment of the present disclosure. In an embodiment, as shown in FIG. 9, the shared sub-pixel areas 5 include a first type of shared sub pixel area 13 and a second type of shared sub pixel area 14. The first type of shared sub-pixel area 13 is shared by k1 pixel areas 2, and the second type of shared sub-pixel area 14 is shared by k2 pixel areas 2, where k1>k2. The first type of shared sub-pixel area 13 includes m1 spare binding areas 6, and the second type of shared sub-pixel area 14 includes m2 spare binding areas 6, where m1>m2.

As for the first type of shared sub-pixel area 13 shared by a larger number of pixel areas 2, the brightness of the first type of shared sub-pixel area 13 will be borrowed by more pixel areas 2. By providing a larger number of spare binding areas 6 in the first type of shared sub-pixel area 13, if the first type of shared sub-pixel area 13 has a situation in which the display light-emitting diode 4 cannot normally emit light, the binding number and binding positions of spare light-emitting diodes 7 have a larger selection range when binding the spare light-emitting diodes 7 in the first type of shared sub-pixel area 13, thereby achieving better brightness borrowing by the multiple pixel areas 2. As for the second type of shared sub-pixel area 14 shared by a smaller number of pixel areas 2, the brightness of the second type of shared sub-pixel area 14 is only borrowed by fewer pixel areas 2, then the binding number and binding position requirements on the spare light-emitting diodes 7 are not very high, so a smaller number of spare binding areas 6 can be provided to reduce an area occupied by the second type of shared sub-pixel area 14.

In addition, it should be noted that transplanting yields of display light-emitting diodes 4 of different colors are different depending on the design difference of the display light-emitting diodes 4 of different colors. In this case, the number of spare binding areas 6 in the shared sub-pixel area 5 can be adjusted according to a light-emitting color of the display light-emitting diode 4 provided in the shared sub-pixel area 5. For example, the display light-emitting diode 4 with a higher transplanting yield is less likely to fail to emit light after transplantation. Therefore, a smaller number of spare binding areas 6 can be provided in the shared sub-pixel area 5 where the display light-emitting diode 4 of this type is located, so as to reduce a space occupied by the spare binding areas 6. While, for the display light-emitting diode 4 with a lower transplanting yield, because the display light-emitting diode 4 of this type has a higher probability of failing to emit light after transplantation, a larger number of spare binding areas 6 may be provided in the shared sub-pixel area 5 where the display light-emitting diode 4 of this type is located. In this way, flexibility of the binding number and binding positions of the spare light-emitting diodes 7 can be improved, thereby achieving better brightness borrowing by the pixel areas 2.

Figure 10:
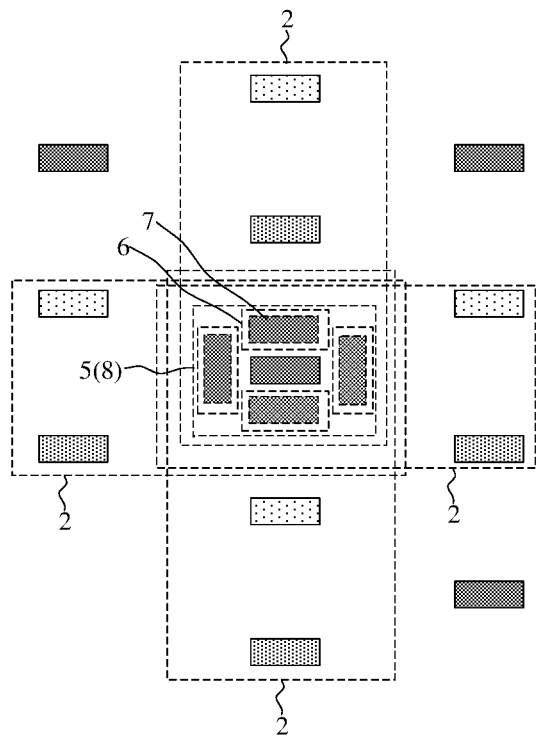
FIG. 10 is a schematic diagram of another structure of a shared sub-pixel area provided by an embodiment of the present disclosure.

FIG. 10 is a schematic diagram of another structure of the shared sub-pixel area provided by an embodiment of the present disclosure. In an embodiment, as shown in FIG. 10, the shared sub-pixel area 5 is shared by k pixel areas 2, where m=k. k spare binding areas 6 one-to-one correspond to the k pixel areas 2, and each spare binding area 6 is located at a side close to the corresponding pixel area 2. In this case, when the display light-emitting diode 4 of the shared sub-pixel area 5 cannot normally emit light, a respective one spare light-emitting diode 7 can be bound to each of the k spare binding areas 6, so that each of the pixel areas 2 sharing the shared sub-pixel area 5 is provided with a respective one spare light-emitting diode 7 at the side close to each pixel area 2, and each pixel area 2 can directly borrow the luminous brightness of the spare light-emitting diode 7 at the side close to the pixel area 2, thereby better achieving brightness borrowing by each pixel area 2.

Further, in the first shared sub-pixel area 8, a borrowing ratio of the luminous brightness of the first shared sub-pixel area 8 borrowed by the i-th pixel area 2 is x, the luminous brightness of the spare light-emitting diode 7 bound in the spare binding area 6 corresponding to the i-th pixel area 2 is L2$i$, and L2$i$ satisfies: $x*L1*0.8 \leq L2i \leq x*L1*1.2$, where $1 \leq i \leq k$.

It should be noted that the borrowing ratio of the luminous brightness of the first shared sub-pixel area 8 borrowed by the i-th pixel area 2 refers to a borrowing ratio of the brightness of the display light-emitting diode 4 borrowed by the i pixel area 2 in a case where the display light-emitting diode 4 in the first shared sub-pixel area 8 can normally emit light. With the luminous brightness of the spare light-emitting diode 7 corresponding to the i-th pixel area 2 and the borrowing ratio of the brightness of the first shared sub-pixel area 8 borrowed by the i-th pixel area 2 satisfying a specific proportional relationship, an actual brightness borrowed by the i-th pixel area 2 from the spare light-emitting diode 7 next to the i-th pixel area 2 can further approach an brightness originally intended to be borrowed from the display light-emitting diode 4, thereby increasing a light-emitting accuracy of each pixel area 2.

Furthermore, L2$i$=L1*x, so that the actual brightness borrowed by the i-th pixel area 2 from the spare light-emitting diode 7 is the same as the brightness originally intended to be borrowed from the display light-emitting diode 4, thereby further increasing the light-emitting accuracy of each pixel area 2.

Figure 11:
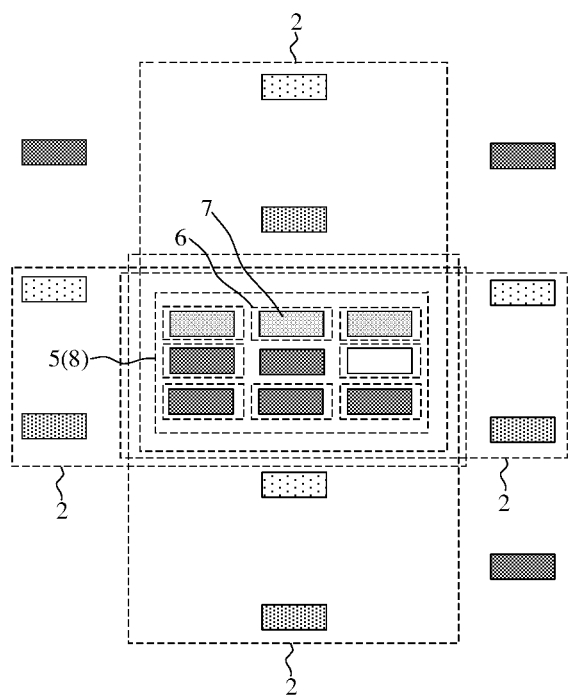
FIG. 11 is a schematic diagram of another structure of the shared sub-pixel area provided by an embodiment of the present disclosure.

FIG. 11 is a schematic diagram of still another structure of a shared sub-pixel area provided by an embodiment of the present disclosure. In an embodiment, as shown in FIG. 11, the shared sub-pixel area 5 is shared by k pixel areas 2, where m>k. In this case, the number of spare binding areas 6 provided in the shared sub-pixel area 5 is larger than the number of pixel areas 2 sharing the shared sub-pixel area 5, thereby further improving flexibility of the binding positions and the number of the spare light-emitting diodes 7.

Figure 12:
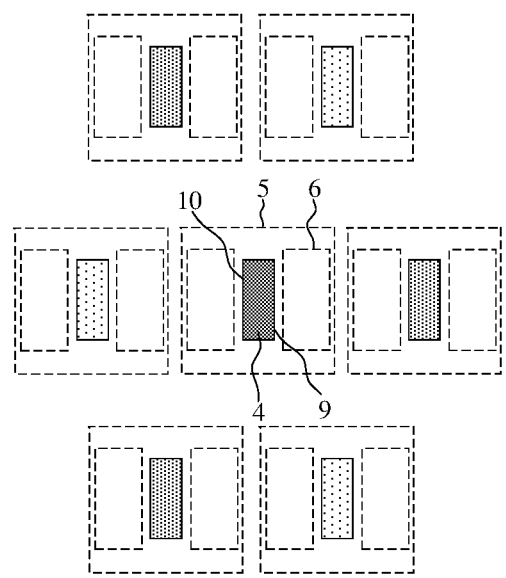
FIG. 12 is a schematic diagram of still another structure of the shared sub-pixel area provided by an embodiment of the present disclosure.
Figure 13:
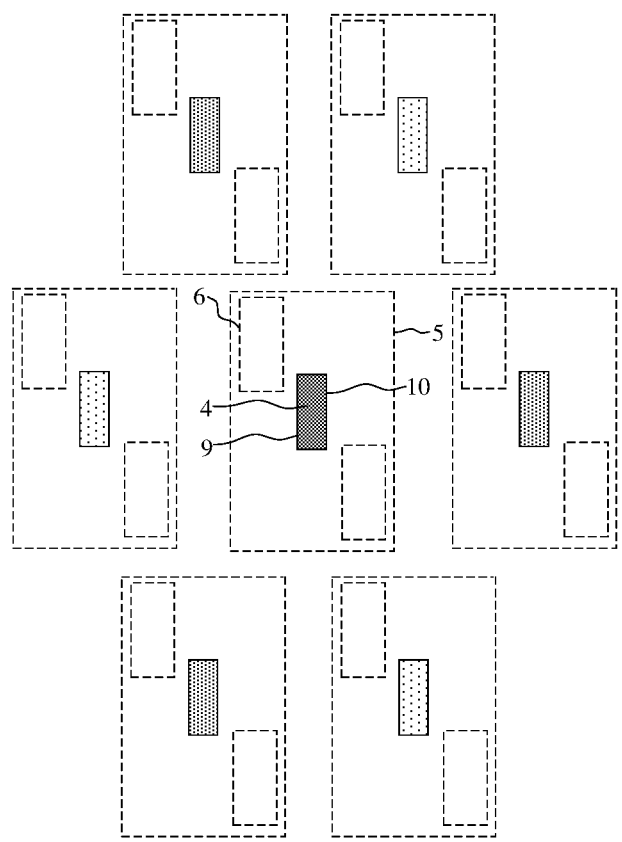
FIG. 13 is a schematic diagram of still another structure of the shared sub-pixel area provided by an embodiment of the present disclosure.

FIG. 12 is a schematic diagram of still another structure of the shared sub-pixel area provided by an embodiment of the present disclosure, and FIG. 13 is a schematic diagram of still another structure of the shared sub-pixel area provided by an embodiment of the present disclosure. In an embodiment, as shown in FIG. 12 and FIG. 13, the light-emitting diode 4 includes a first side 9 and a second side 10 that are opposite to each other; m=2, one spare binding area 6 is provided at the first side 9 of the display light-emitting diode 4, and the other spare binding area 6 is provided at the second side 10 of the display light-emitting diode 4.

With this arrangement, on the one hand, when the display light-emitting diode 4 in the shared sub-pixel area 5 cannot emit light normally, it can be ensured that the two spare light-emitting diodes 7 bound are located at opposite sides of the display light-emitting diodes 4, so that an equivalent light-emitting center of an overall light-emitting area formed by the spare light-emitting diodes 7 is located between the two spare light-emitting diodes 7, thereby further approaching the light-emitting center of the original display light-emitting diode 4; on the other hand, with the only two spare binding areas 6 provided in the shared sub-pixel area 5, when the shared sub-pixel area 5 does not need to bind the spare light-emitting diodes 7, a non-light-emitting area in the shared sub-pixel area 5 can be reduced, thereby improving an light output effect of the shared sub-pixel area 5.

Figure 14:
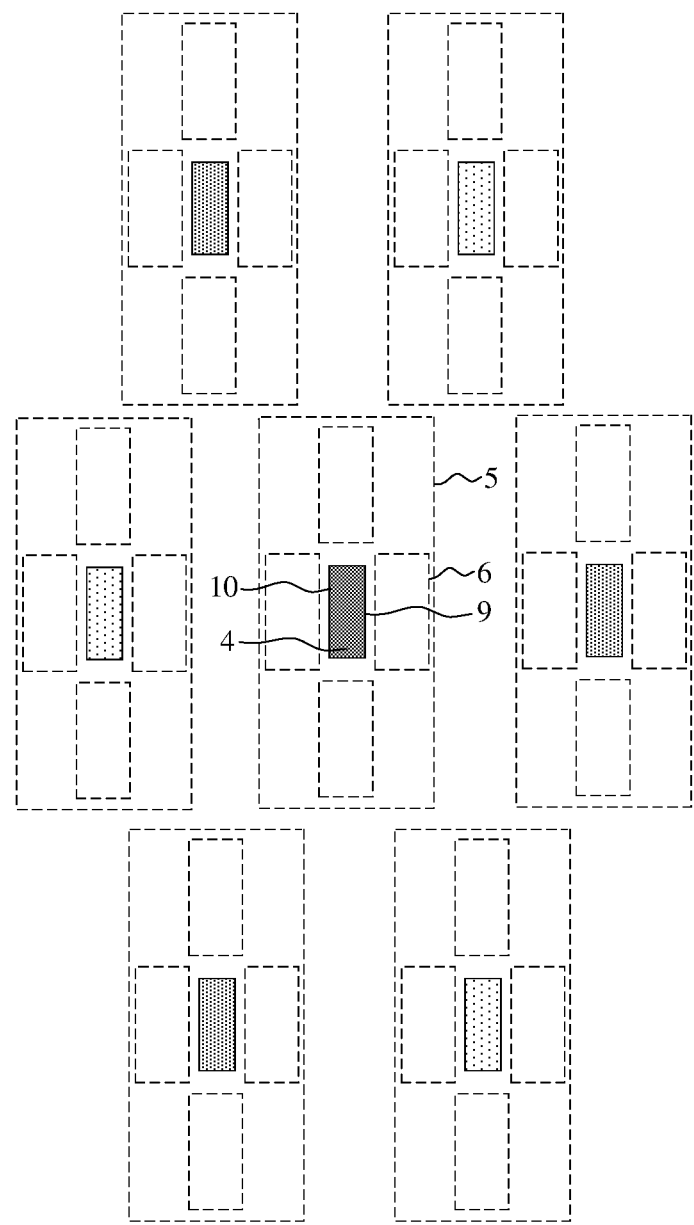
FIG. 14 is a schematic diagram of still another structure of the shared sub-pixel area provided by an embodiment of the present disclosure.
Figure 15:
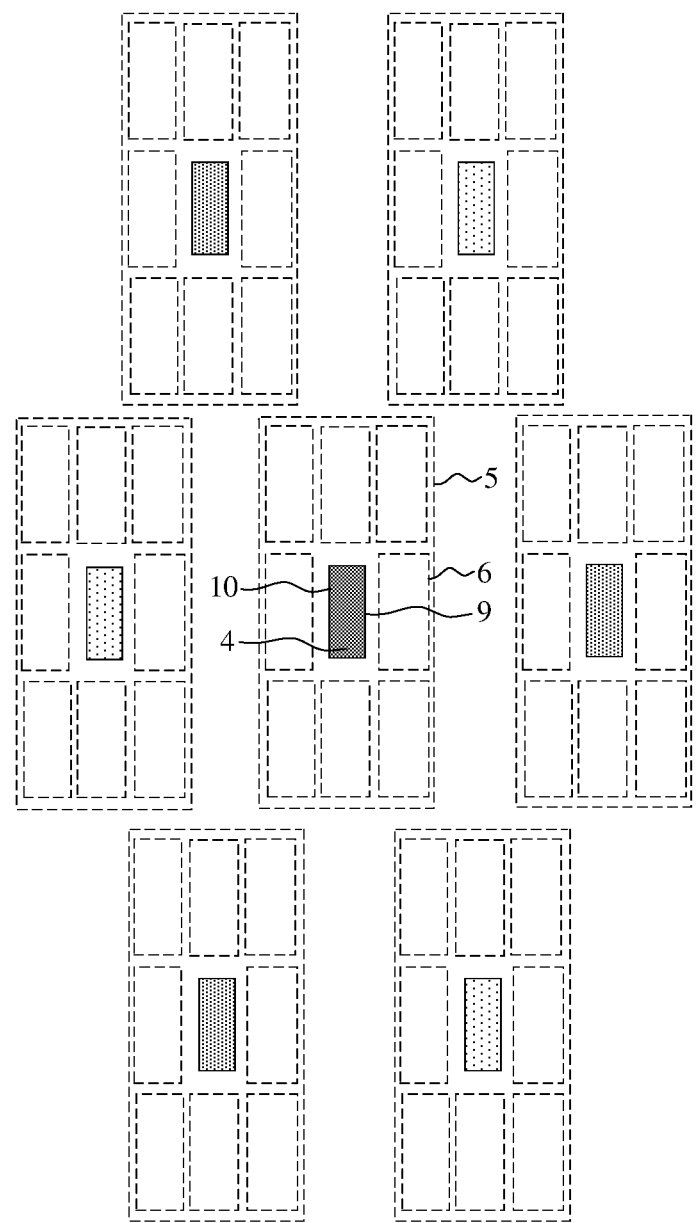
FIG. 15 is a schematic diagram of still another structure of the shared sub-pixel area provided by an embodiment of the present disclosure.

FIG. 14 is a schematic diagram of still another structure of a shared sub-pixel area provided by an embodiment of the present disclosure, and FIG. 15 is a schematic diagram of still another structure of a shared sub-pixel area provided by an embodiment of the present disclosure. Alternatively, as shown in FIG. 14 and FIG. 15, m>2, and the m spare binding areas 6 surround the display light-emitting diode 4.

With this arrangement, when the display light-emitting diode 4 in the shared sub-pixel area 5 cannot normally emit light, the spare light-emitting diodes 7 can be bound in any two or more spare binding areas 6 selected from the m spare binding areas 6. In this way, it increases selectivity of the binding number and the binding positions of the spare light-emitting diodes 7, thereby improving controllability of the position of the equivalent light-emitting center of the overall light-emitting area formed by the spare light-emitting diodes 7. Moreover, with the m spare binding areas 6 surrounding the display light-emitting diode 4, when each of the m spare binding areas 6 is bound with a respective one spare light-emitting diode 7, the m spare light-emitting diodes 7 emit light surrounding the display light-emitting diode 4, thereby effectively improving the light-emitting uniformity of the first shared sub-pixel area 8.

Figure 16:
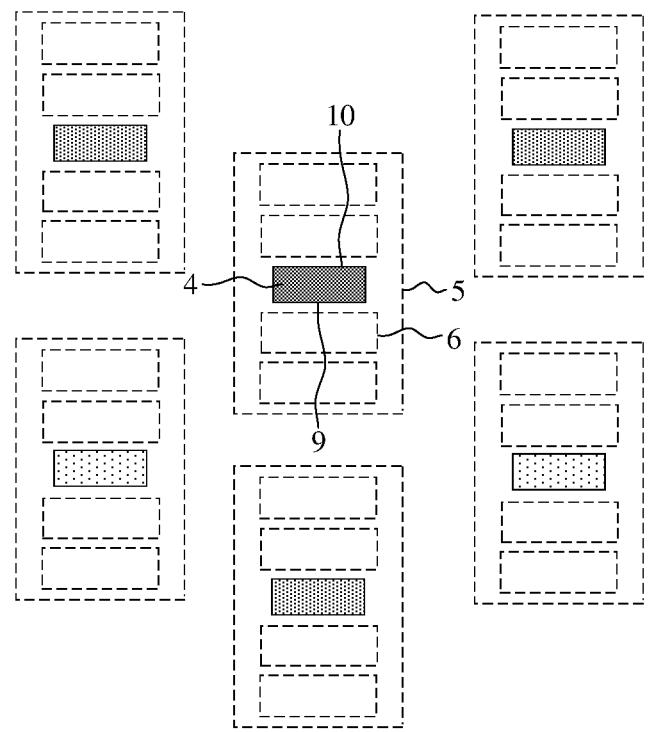
FIG. 16 is a schematic diagram of still another structure of the shared sub-pixel area provided by an embodiment of the present disclosure.

FIG. 16 is a schematic diagram of still another structure of a shared sub-pixel area provided by an embodiment of the present disclosure. In an embodiment, as shown in FIG. 16, the light-emitting diode 4 has a first side 9 and a second side 10 that are opposite to each other; m is an even number larger than 2, m/2 of the m spare binding areas 6 are located at the first side 9 of the display light-emitting diode 4, and the remaining m/2 of the m spare binding areas 6 are located at the second side 10 of the display light-emitting diode 4. That is to say, at least one spare binding area 6 is provided at each of the two opposite sides of the display light-emitting diode 4, and when binding the spare light-emitting diodes 7 in the shared sub-pixel area 5, it can be selected that each of the m spare binding areas 6 is bound with a respective one spare light-emitting diode 7, so that at least two light-emitting areas are provided at two sides of the display light-emitting diode 4, thereby further improving the light-emitting uniformity of the first shared sub-pixel area 8.

In an embodiment, as for the first shared sub-pixel area 8, let m=2n, so as to provide a larger selection range of the binding number and binding positions of the spare light-emitting diodes 7, thereby further improving the binding flexibility of the spare light-emitting diodes 7.

Figure 17:
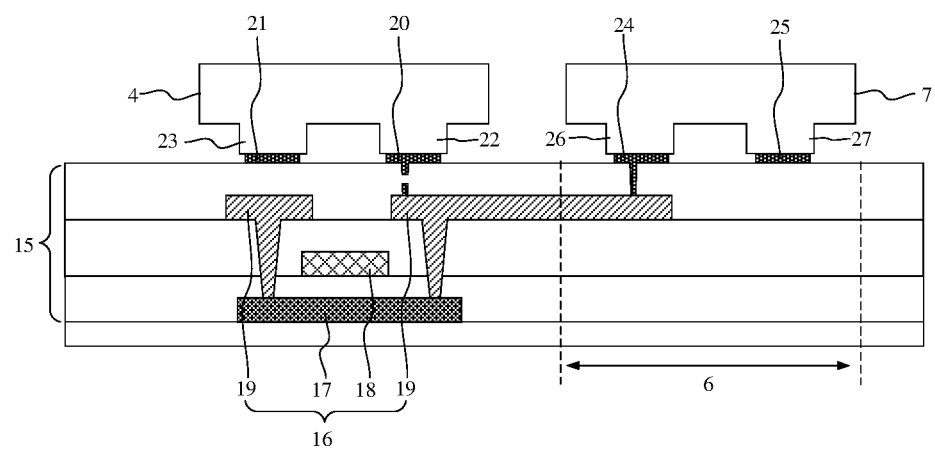
FIG. 17 is a schematic diagram of binding of a display light-emitting diode and a spare light-emitting diode provided by an embodiment of the present disclosure.

FIG. 17 is a schematic diagram of binding of a display light-emitting diode and a spare light-emitting diode according to an embodiment of the present disclosure. In an embodiment, as shown in FIG. 17, the display panel includes an array layer 15 that includes a driving circuit 16 configured to drive the display light-emitting diode 4 to emit light. The driving circuit 16 includes an active layer 17, a gate layer 18, and a source-drain layer 19 arranged in sequence along a light output direction of the display panel. In addition, a display anode binding area 20 and a display cathode binding area 21 are further provided at a side of the array layer 15 facing a light output surface of the display panel. The display anode binding area 20 is configured to bind an anode 22 of the display light-emitting diode 4, and the display cathode binding area 21 is configured to bind a cathode 23 of the display light-emitting diode 4. The display anode binding area 20 is electrically connected to a source electrode or a drain electrode in the source-drain layer 19, so as to receive a driving current signal provided by the driving circuit 16, so that the display light-emitting diode 4 emits light under an action of the driving current signal.

However, when it is detected that the transplanted display light-emitting diode 4 cannot emit light normally, it is necessary to re-bond the spare light-emitting diode 7 next to the transplanted display light-emitting diode 4. Because the re-bound spare light-emitting diode 7 can compensate the brightness of the display light-emitting diode 4, it is necessary to ensure that the display light-emitting diode 4 no longer emits light subsequently in order to ensure the accuracy of the luminous brightness of the first shared sub-pixel area 8, and therefore, referring to FIG. 17 again, a signal transmission path between the display anode binding area 20 and the driving circuit 16 is interrupted, so that the display light-emitting diode 4 cannot receive the driving current signal provided by the driving circuit 16.

In an embodiment, referring to FIG. 17 again, in order to achieve binding of the spare light-emitting diode 7, each spare binding area includes a spare anode binding area 24 to which the anode 26 of the spare light-emitting diode 7 is to be bound, and a spare cathode binding area 25 to which a cathode 27 of the spare light-emitting diode 7 is to be bound. The spare anode binding area 24 may also be connected to the driving circuit 16 for driving the display light-emitting diode 4, so that the spare light-emitting diode 7 and the display light-emitting diode 4 share one driving circuit 16, thereby reducing the number of driving circuits 16 required by the display panel and thus reducing the complexity of wiring.

Figure 18:
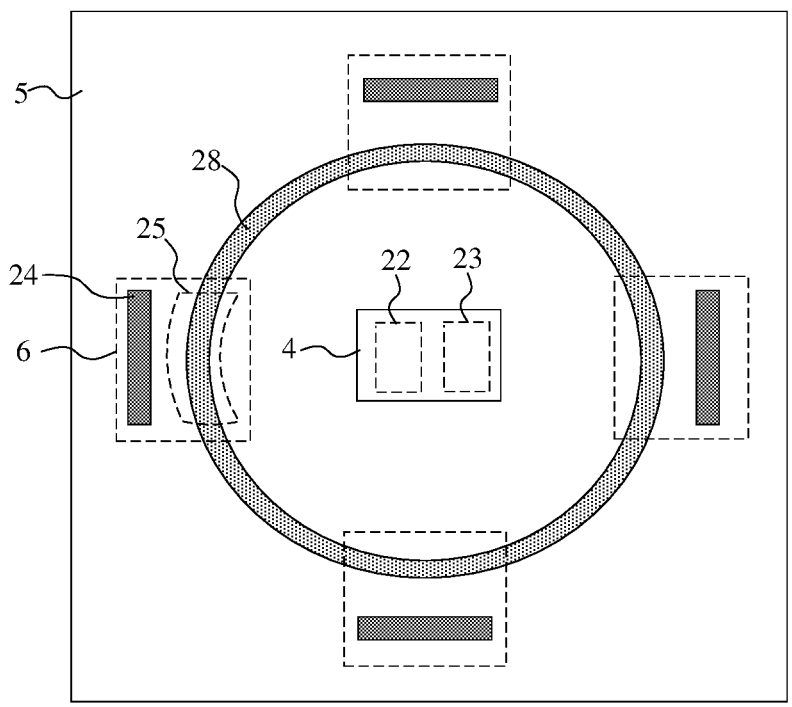
FIG. 18 is a schematic diagram of a structure of a spare binding area provided by an embodiment of the present disclosure.

FIG. 18 is a schematic structural diagram of a spare binding area provided by an embodiment of the present disclosure. Further, as shown in FIG. 18, an overall spare cathode binding area 28, which is a ring structure surrounding the display light-emitting diode 4, is bound in the shared sub-pixel area 5. The overall spare cathode binding area 28 includes m spare cathode binding areas 25, and the m spare cathode binding areas 25 one-to-one correspond to the m spare binding areas 6. The cathode binding area 25 is configured to bind the cathode 27 of the spare light-emitting diode 7.

Since the m spare cathode binding areas 25 receive a same cathode signal, with the spare cathode binding areas 25 forming a ring-shaped overall spare cathode binding area 28, when binding the spare light-emitting diodes 7, even if a deviation in the binding position of the cathode 27 of the spare light-emitting diode 7 is caused by a position aligning factor, it can still ensure that the cathode 27 is in contact with other position of the overall spare cathode binding area 28, thereby improving the reliability of the binding of the spare light-emitting diode 7.

Further, referring to FIG. 18 again, each spare binding area includes a spare anode binding area 24. The spare anode binding area 24 is located at a side of the overall spare cathode binding area 28 away from the display light-emitting diode 4 or at a side of the overall spare cathode binding area 28 close to the display light-emitting diode 4, and is configured to provide a driving current signal to the anode of the spare light-emitting diode 7 to drive the spare light-emitting diode 7 to emit light.

Figure 19:
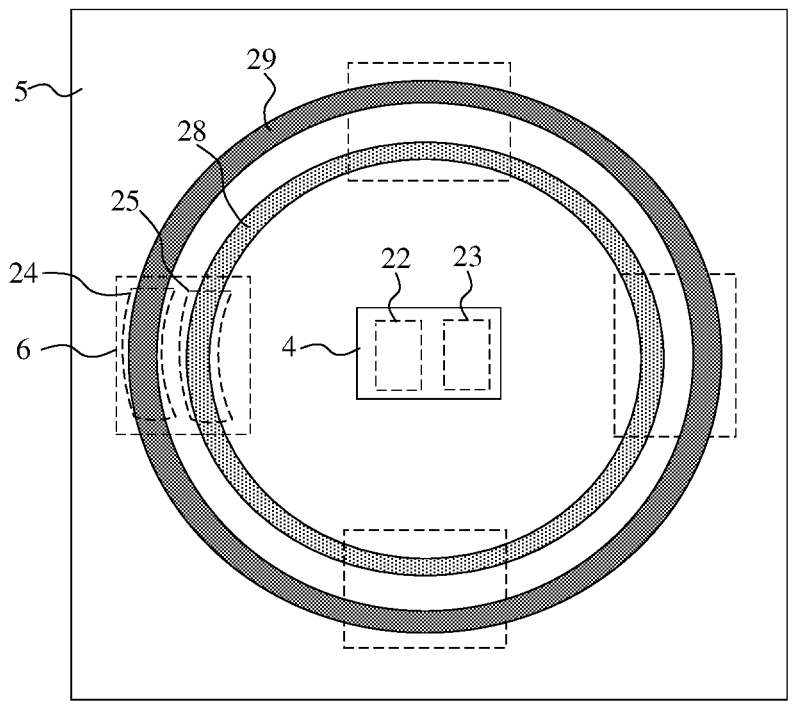
FIG. 19 is a schematic diagram of another structure of the spare binding area provided by an embodiment of the present disclosure.

FIG. 19 is a schematic diagram of another structure of the spare bonding area provided by the embodiment of the present disclosure. In an embodiment, as shown in FIG. 19, an overall spare anode binding area 29 is provided in the shared sub-pixel area 5, and the overall spare anode binding area 29 is a ring structure surrounding the display light-emitting diode 4. The overall spare anode binding area 29 includes m spare anode binding areas 24, and the m spare anode binding areas 24 one-to-one correspond to the m spare binding areas 6. Each spare anode binding area 24 is configured to bind an anode 26 of a spare light-emitting diode 7. In this case, the m spare anode binding areas 24 receive a same driving current signal, and the bound spare light-emitting diodes 7 have a same luminous brightness.

The spare anode binding areas 24 form a ring-shaped overall spare anode binding area 29. In this way, when binding the spare light-emitting diode 7, even if a deviation in the binding position of the anode 26 of the spare light-emitting diode 7 is caused by a position aligning factor, it can still ensure that the anode 26 is in contact with other position of the overall spare anode binding area 29, thereby improving the reliability of the binding of the spare light-emitting diode 7.

Figure 20:
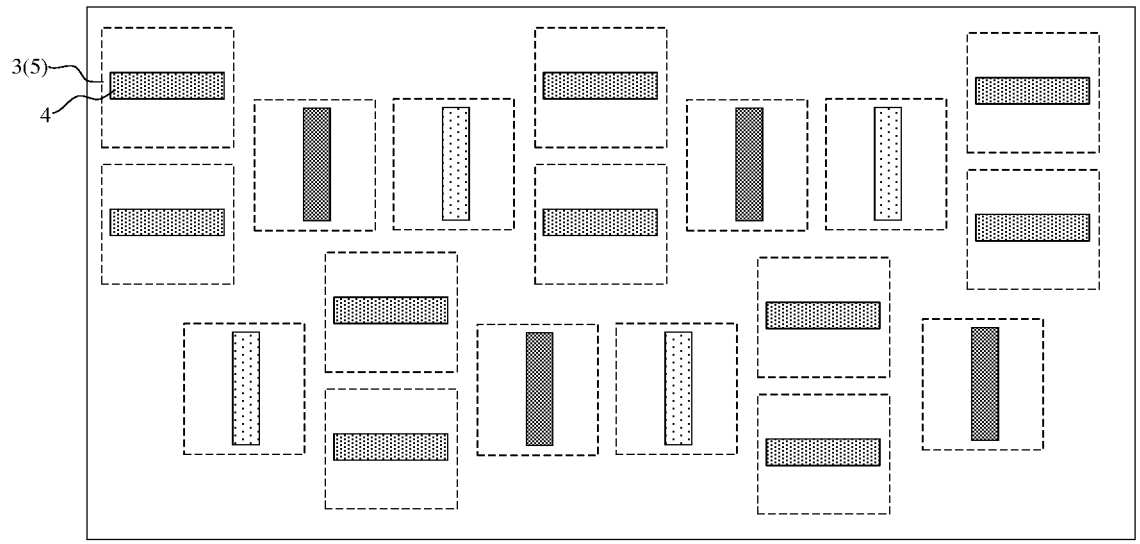
FIG. 20 is a schematic diagram of an arrangement of sub-pixel areas provided by an embodiment of the present disclosure.
Figure 21:
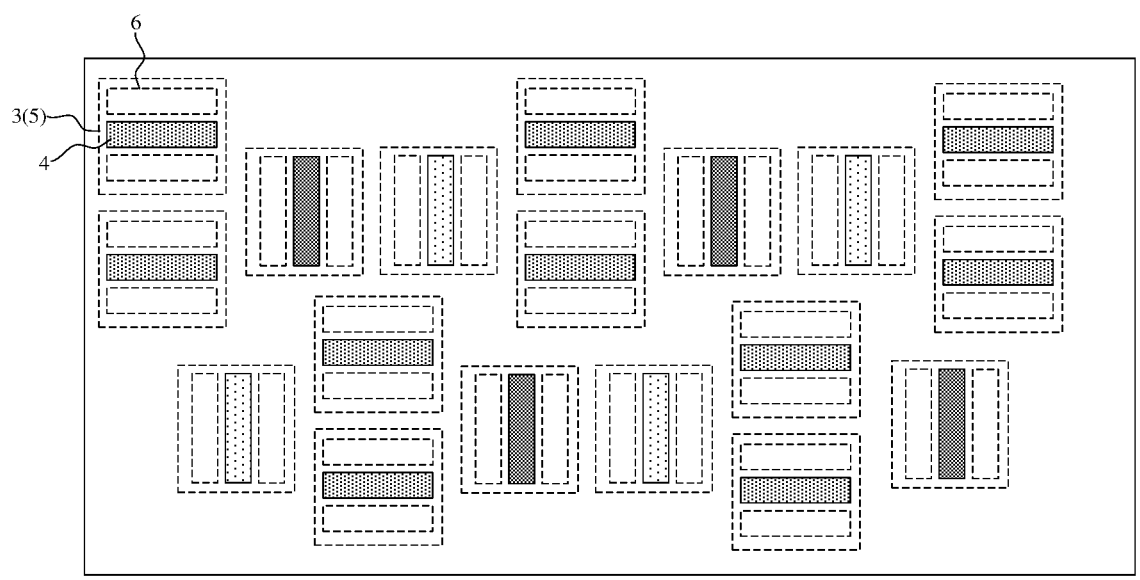
FIG. 21 is a schematic diagram of an arrangement of spare binding areas corresponding to FIG. 20.
Figure 22:
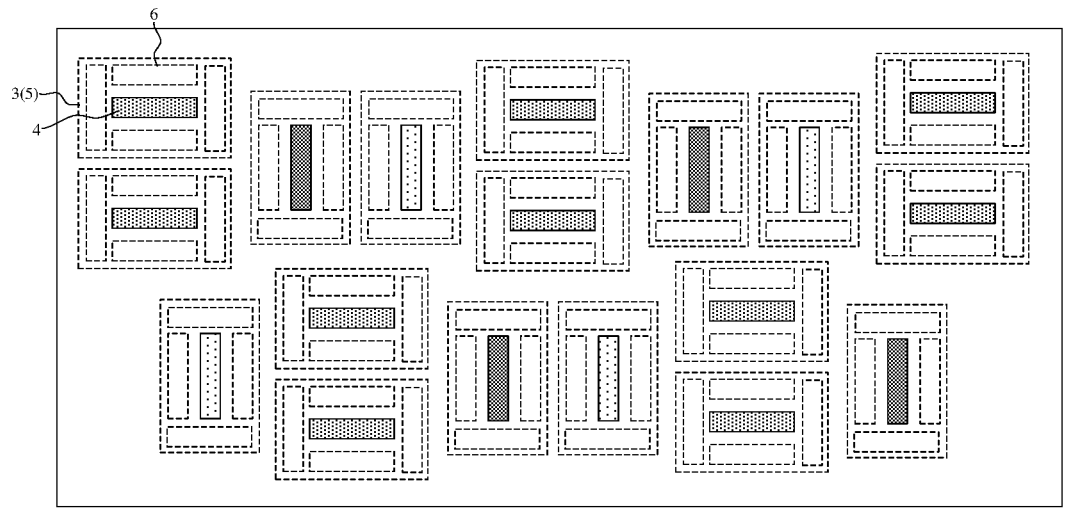
FIG. 22 is a schematic diagram of another arrangement of the spare binding areas corresponding to FIG. 20.

In addition, it should be noted that the present disclosure is not limited to the arrangements of the sub-pixel areas 3 shown in the above-mentioned figures, and other arrangement manners are also applicable. Exemplarily, in an arrangement of the sub-pixel areas shown in FIG. 20, the arrangement of the spare bonding areas 6 in the shared sub-pixel area 5 may be as shown in FIG. 21, in which one spare binding area 6 is respectively provided at each of two sides of the display light-emitting diode 4, or as shown in FIG. 22, in which four spare binding areas 6 are provided next to the display light-emitting diode 4, and the four spare binding areas 6 surround the display light-emitting diode 4.

Figure 23:
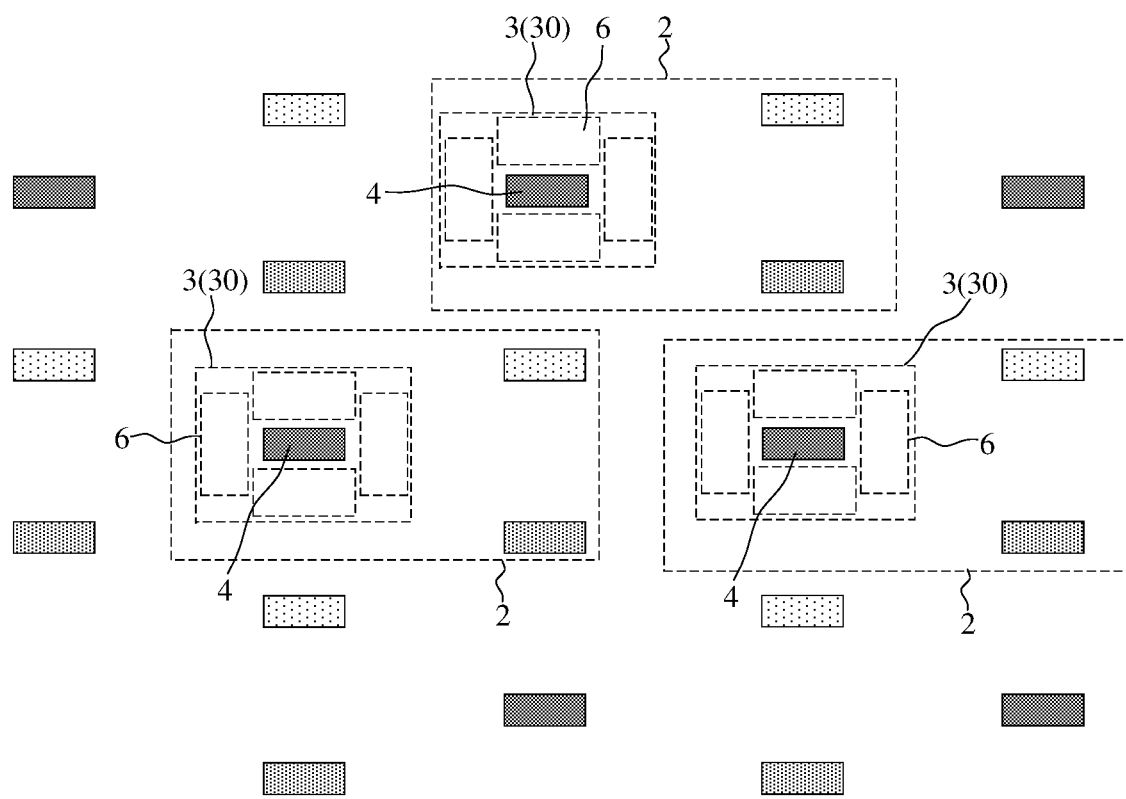
FIG. 23 is a schematic structural diagram of a non-shared sub-pixel area provided by an embodiment of the present disclosure.

FIG. 23 is a schematic structural diagram of a non-shared sub-pixel area provided by an embodiment of the present disclosure. In an embodiment, as shown in FIG. 23, the sub-pixel areas 3 further include a non-shared sub-pixel area 30, and the non-shared sub-pixel area 30 is merely used for forming one pixel area 2. The non-shared sub-pixel area 30 includes z spare binding areas 6, where z≥2, and z is a positive integer. Herein, z may be equal to or different from m.

With the non-shared sub-pixel area 30 being merely used forming one pixel area 2, a luminous brightness of the non-shared sub-pixel area 30 is merely used to provide the luminous brightness required by the one pixel area 2 containing the non-shared sub-pixel area 30, and no brightness borrowing to other pixel areas 2 occurs. In this case, a plurality of spare sub-pixel areas 6 may also be provided in the non-shared sub-pixel area 30 to emit light when the display light-emitting diodes 4 in the non-shared sub-pixel area 30 cannot emit light. In this way, not only the flexibility of the binding number and binding positions of the spare light-emitting diodes 7 in the non-shared sub-pixel area 30 is improved, but also the binding number and binding positions of the spare light-emitting diodes 7 can be adjusted in such a manner that the equivalent light-emitting center of the overall light-emitting area formed by the bound spare light-emitting diodes 7 approaches the light-emitting center of the original display light-emitting diode 4, thereby increasing the luminous accuracy of the non-shared sub-pixel area 30 and the pixel area 2 formed by the non-shared sub-pixel area 30.

Figure 24:
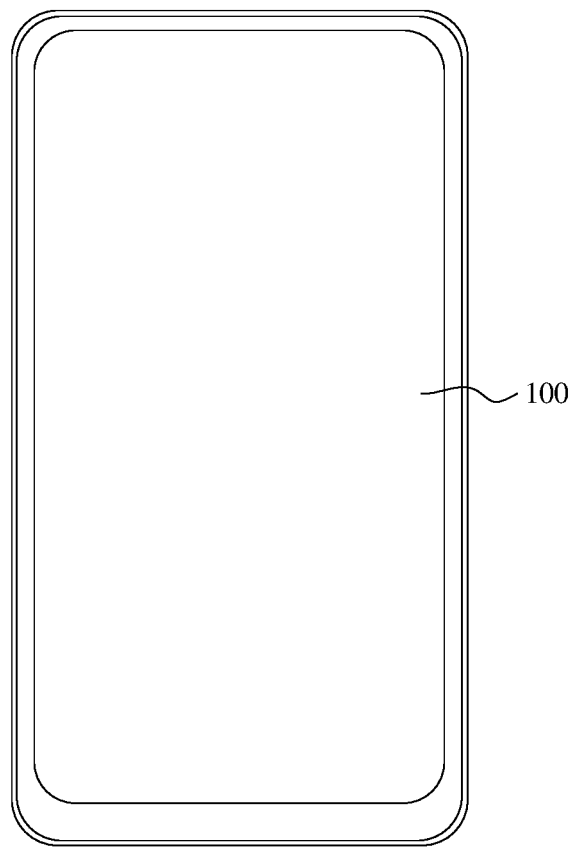
FIG. 24 is a schematic structural diagram of a display device provided by an embodiment of the present disclosure.

Based on the same inventive concept as above, an embodiment of the present disclosure provides a display device. FIG. 24 is a schematic structural diagram of the display device provided by the embodiment of the present disclosure. As shown in FIG. 24, the display device includes the above-mentioned display panel 100. The specific structure of the display panel 100 has been described in detail in the foregoing embodiments, and will not be repeated herein. It should be noted that, the display device shown in FIG. 24 is merely illustrative, and the display device may be any electronic device with a display function, such as a mobile phone, a tablet computer, a notebook computer, an electronic paper book, or a television.

The above are representative embodiments of the present disclosure and are not intended to limit the present disclosure. Any modification, equivalent replacement, improvement, etc. made within the principle of the present disclosure shall be included in the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising a display area comprising a plurality of pixel areas, each of the plurality of pixel areas comprising at least two sub-pixel areas, each of the at least two sub-pixel areas being provided with a display light-emitting diode,
    wherein all sub-pixel areas of the plurality of pixel areas comprise shared sub-pixel areas, each of the shared sub-pixel areas is shared by at least two of the plurality of pixel areas, and each of the shared sub-pixel areas comprises m spare binding areas, to each of which spare binding area a respective one spare light-emitting diode is configured to be bound, where m is a positive integer larger and m≥2,
    wherein the shared sub-pixel areas comprise at least one first shared sub-pixel area in each of which the respective display light-emitting diode does not emit light when the display panel is driven to emit light; and each of the at least one first shared sub-pixel area is further provided with n spare light-emitting diodes, where n is a positive integer and 2≤n≤m, and
    wherein when the display panel is driven to emit light, a standard brightness required to be displayed by each of the at least one first shared sub-pixel area is L1, and a luminous brightness of each of the n spare light-emitting diodes in the first shared sub-pixel area is L2, where L2<L1.

2. The display panel according to claim 1, wherein a total luminous brightness of the n spare light-emitting diodes in the first shared sub-pixel area is L3, where 0.8*L1≤L3≤1.2*L1.

3. The display panel according to claim 1, wherein the n spare light-emitting diodes are respectively located at opposite sides of the display light-emitting diode.

4. The display panel according to claim 3, wherein the n spare light-emitting diodes located at opposite sides of the display light-emitting diode are symmetrically distributed about a center point of the display light-emitting diode, or the n spare light-emitting diodes located at opposite sides of the display light-emitting diode are symmetrically distributed about a central axis of the display light-emitting diode.

5. The display panel according to claim 1, wherein the n spare light-emitting diodes have a same luminous brightness, and a center point of each of the n spare light-emitting diodes is equally distanced from a center point of the display light-emitting diode.

6. The display panel according to claim 1, wherein the n spare light-emitting diodes comprises a first spare light-emitting diode and a second spare light-emitting diode,
    wherein a luminous brightness of the first spare light-emitting diode is L21, and a luminous brightness of the second spare light-emitting diode is L22, where L21>L22, and
    wherein a distance between a center point of the first spare light-emitting diode and a center point of the display light-emitting diode is H1, and a distance between a center point of the second spare light-emitting diode and the center point of the display light-emitting diode is H2, where H1<H2.

7. The display panel according to claim 1, wherein each shared sub-pixel area is shared by k pixel areas of the plurality of pixel areas, where m<k.

8. The display panel according to claim 1, wherein the shared sub-pixel areas comprises a first type of shared sub-pixel area and a second type of shared sub-pixel area, the first type of shared sub-pixel area is shared by k1 pixel areas of the plurality of pixel areas, and the second shared sub-pixel area is shared by k2 pixel areas of the plurality of pixel areas, where k1>k2, and
    wherein the first type of shared sub-pixel area comprises m1 spare binding areas, and the second type of shared sub-pixel area comprises m2 spare binding areas, where m1>m2.

9. The display panel according to claim 1, wherein each shared sub-pixel area is shared by k pixel areas of the plurality of pixel areas, where m=k; and the m spare binding areas one-to-one correspond to the k pixel areas, and each of the m spare binding areas is located at a side adjacent to the corresponding pixel area of the k pixel areas.

10. The display panel according to claim 9, wherein a borrowing ratio of a luminous brightness of the first shared sub-pixel area borrowed by an i-th pixel area of the m pixel areas is x, and a luminous brightness of the spare light-emitting diode bound in one of the m spare binding areas corresponding to the i-th pixel area is $L2i$, where $x*L1*0.8 \leq L2i \leq x*L1*1.2$, and $1 \leq i \leq k$.

11. The display panel according to claim 1, wherein each of the shared sub-pixel areas is shared by k pixel areas of the plurality of pixel areas, where m>k.

12. The display panel according to claim 1, wherein the display light-emitting diode has a first side and a second side that are opposite to each other, and
wherein m=2, one of the two spare binding areas is provided at the first side of the display light-emitting diode, and the other one of the two spare binding areas is provided at the second side of the display light-emitting diode.

13. The display panel according to claim 1, wherein m>2, and the m spare binding areas surround the display light-emitting diode.

14. The display panel according to claim 1, wherein the display light-emitting diode has a first side and a second side that are opposite to each other, and
wherein m is an even number larger than 2, m/2 of the m spare binding areas are provided at the first side of the display light-emitting diode, and the remaining m/2 of the m spare binding areas are provided at the second side of the display light-emitting diode.

15. The display panel according to claim 1, wherein m=2n.

16. The display panel according to claim 1, wherein an overall spare cathode binding area is provided in each of the shared sub-pixel areas, and the overall spare cathode binding area is formed as a ring structure surrounding the display light-emitting diode, and
wherein the overall spare cathode binding area comprises m spare cathode binding areas, the m spare cathode binding areas one-to-one correspond to the m spare binding areas, and each of the m spare cathode binding areas is configured to bind a cathode of a respective one spare light-emitting diode.

17. The display panel according to claim 16, wherein each of the m spare binding areas further comprises a spare anode binding area, and
the spare anode binding area is located at a side of the overall spare cathode binding area away from the display light-emitting diode, or the spare anode binding area is located at a side of the overall spare cathode binding area adjacent to the display light-emitting diode.

18. The display panel according to claim 16, wherein each of the shared sub-pixel areas is further provided with an overall spare anode binding area, and the overall spare anode binding area is formed as another ring structure surrounding the display light-emitting diode, and
wherein the overall spare anode binding area comprises m spare anode binding areas, the m spare anode binding areas one-to-one correspond to the m spare binding areas, and each of the m spare anode binding areas is configured to bind an anode of a respective one spare light-emitting diode.

19. The display panel according to claim 1, wherein all sub-pixel areas of the plurality of pixel areas further comprises at least one non-shared sub-pixel area, each of the at least one non-shared sub-pixel area is only configured to form one of the pixel areas, and each of the at least one non-shared sub-pixel area comprises z spare binding areas, wherein z is a positive integer larger than or equal to 2.

20. A display device, comprising a display panel comprising a plurality of pixel areas, each of the plurality of pixel areas comprising at least two sub-pixel areas, each of the at least two sub-pixel areas being provided with a display light-emitting diode,
wherein all sub-pixel areas of the plurality of pixel areas comprise shared sub-pixel areas, each of the shared sub-pixel areas is shared by at least two of the plurality of pixel areas, and each of the shared sub-pixel areas comprises m spare binding areas, to each of which spare binding area a respective one spare light-emitting diode is configured to be bound, where m is a positive integer larger and m≥2,
wherein the shared sub-pixel areas comprise at least one first shared sub-pixel area in each of which the respective display light-emitting diode does not emit light when the display panel is driven to emit light; and each of the at least one first shared sub-pixel area is further provided with n spare light-emitting diodes, where n is a positive integer and 2≤n≤m, and
wherein when the display panel is driven to emit light, a standard brightness required to be displayed by each of the at least one first shared sub-pixel area is L1, and a luminous brightness of each of the n spare light-emitting diodes in the first shared sub-pixel area is L2, where L2<L1.

\* \* \* \* \*